United States Patent [19]

Kim

[11] Patent Number: 5,518,957

[45] Date of Patent: May 21, 1996

[54] METHOD FOR MAKING A THIN PROFILE SEMICONDUCTOR PACKAGE

[75] Inventor: Gu S. Kim, Seoul, Rep. of Korea

[73] Assignee: Samsung Electronics Co., Ltd., Suwon, Rep. of Korea

[21] Appl. No.: 218,939

[22] Filed: Mar. 28, 1994

Related U.S. Application Data

[62] Division of Ser. No. 955,772, Oct. 2, 1992, abandoned.

[30] Foreign Application Priority Data

Oct. 10, 1991 [KR] Rep. of Korea ............... 91-17775

[51] Int. Cl.$^6$ .................. H01L 21/283; H01L 21/56; H01L 21/58; H01L 21/603
[52] U.S. Cl. .................. 437/182; 437/212; 437/216; 437/217; 228/180.22
[58] Field of Search ................ 437/212, 213, 437/207, 216, 217, 183, 221, 182; 228/180.21, 180.22; 257/676, 735, 753, 783

[56] References Cited

U.S. PATENT DOCUMENTS

| | | | |
|---|---|---|---|
| 3,537,175 | 11/1970 | St. Clair et al. | 29/624 |
| 3,711,625 | 1/1973 | Dupuis | 156/261 |
| 3,868,724 | 2/1975 | Perrino | 257/673 |
| 4,328,262 | 5/1982 | Kurahashi et al. | 427/93 |
| 4,908,689 | 3/1990 | McBride et al. | 257/738 |
| 5,136,367 | 8/1992 | Chiu | 257/673 |

FOREIGN PATENT DOCUMENTS

| | | | |
|---|---|---|---|
| 52-40973 | 3/1977 | Japan . | |
| 0032161 | 2/1984 | Japan | 257/790 |
| 0088348 | 4/1987 | Japan | 257/787 |
| 62-136049 | 6/1987 | Japan . | |
| 62-232147 | 10/1987 | Japan . | |
| 63-142663 | 6/1988 | Japan . | |
| 63-245942 | 10/1988 | Japan . | |
| 0263748 | 10/1988 | Japan | 257/787 |
| 1-47038 | 2/1989 | Japan | 437/212 |
| 1-179334 | 7/1989 | Japan | 437/183 |
| 0128453 | 5/1990 | Japan | 257/787 |

OTHER PUBLICATIONS

IBM TDB, Inner Lead Bonding for TAB Package, vol. 33 No. 3A, Aug. 1990, pp. 375–376.

*Primary Examiner*—George Fourson
*Assistant Examiner*—David E. Graybill
*Attorney, Agent, or Firm*—Cushman Darby & Cushman

[57] ABSTRACT

A process for manufacturing a thin profile semiconductor package by means of TAB (tape automated bonding). A barrier metal layer is formed on bonding pads formed on portions of a chip covered with insulating layers. A photoresist layer is formed on the resultant structure, and patterned so as to expose the barrier metal layer, and then bumps are formed on the barrier metal layer as high as the photoresist layer. The semiconductor package is completed by bonding the bumps and inner lead portions of the TAB tape. The photoresist remains on the completed package as a permanent protective layer.

14 Claims, 1 Drawing Sheet

METHOD FOR MAKING A THIN PROFILE SEMICONDUCTOR PACKAGE

This is a division of application Ser. No. 07/955,772, filed Oct. 2, 1992, abandoned.

BACKGROUND OF THE INVENTION

The present invention relates to a thinner, more reliable semiconductor package which is fabricated by means of an improved TAB (tape automated bonding) method.

FIG. 1 shows a cross-sectional view of a semiconductor package fabricated by a conventional TAB method. As can be seen in FIG. 1, in accordance with the conventional TAB method, a plurality of bonding pads 13 are formed on predetermined portions of a semiconductor substrate 11, while the remaining portions of the semiconductor substrate 11 are covered with an insulating layer 15. Bumps 19 are formed on the surface of a barrier metal layer 17 formed on the surface of the bonding pads 13. The bumps 19 are connected to one of the ends of inner leads 21 attached to polyimide tape 23, while the other ends of the inner leads 21 are connected to outer leads 25 which are not attached to the polyimide tape 23. Also, a protective layer 27 is formed over the entire surface of the chip, covering a portion of the inner leads 21 bonded to the bumps 19.

After depositing the barrier metal layer 17, a photoresist layer (not shown) is deposited over the entire surface of the chip, and thereafter, the barrier metal layer 17 is exposed by etching the photoresist layer by means of a conventional photolithography process. After forming the bumps 19 on the barrier metal layer 17, the photoresist layer is removed. Subsequently, the bumps 19 and the inner leads 21 of the tape 23 are bonded together, e.g., by means of a thermocompression or reflowing method. Finally, the protective layer 27 is formed over the entire surface of the chip, in order not to expose the portion of the inner leads 21 bonded to the bumps 19.

The conventional TAB method suffers from at least the following shortcomings. If the thermocompression bonding method is used to bond the bumps 19 and the inner leads 21, the inner leads may inadvertently be brought into contact with the edge of the chip by compressive force, thereby resulting in a short-circuit problem. If the reflow-bonding method is used, since the bumps are easily melted and spread out along the inner leads, it is difficult to control the size of the bumps and further, this may cause neighboring pads to be bridged by the spread bumps, thereby also resulting in a short-circuit problem. In addition, it is essential that the protective layer cover the upper surface of the inner leads, thereby unduly limiting the achievable thinness of the package.

SUMMARY OF THE INVENTION

The present invention encompasses a thin profile semiconductor package fabricated by means of a TAB (tape automated bonding method). A barrier metal layer is formed on bonding pads formed on predetermined portions of a chip covered with insulating layers. A photoresist layer is formed on the resultant structure, and patterned so as to expose the barrier metal layer, and then bumps are formed on the barrier metal layer as high as the photoresist layer. The semiconductor package is completed by bonding the bumps and inner lead portions of the TAB tape.

DETAILED DESCRIPTION OF THE PREFERRED EMBODIMENT

Figure 1:
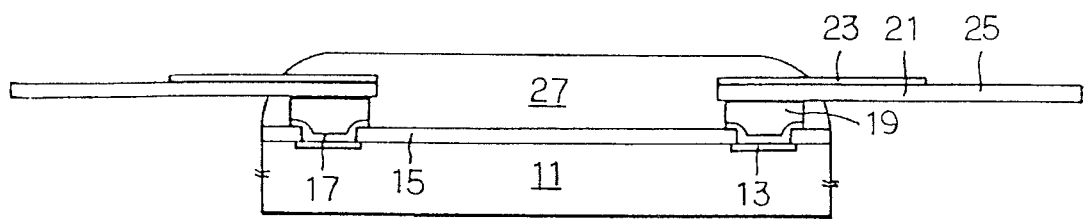
FIG. 1 is a vertical cross-sectional view of a semiconductor package using a conventional TAB method.
Figure 2:
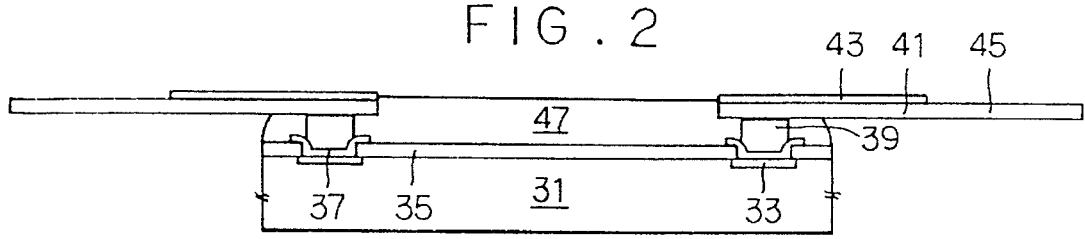
FIG. 2 is a vertical cross-sectional view of a semiconductor package using a TAB method according to the present invention; and, FIGS. 3A–3C depict successive steps of a process for making the semiconductor package depicted in FIG. 2.

With reference now to FIG. 2, there can be seen a semiconductor package fabricated by a TAB method in accordance with a preferred embodiment of the present invention. More particularly, a plurality of bonding pads 33 made of, e.g., Al, are formed on predetermined portions of a semiconductor substrate 31, and the remaining portions are covered with an insulating layer 35 made of, e.g., $SiO_2$ and $Si_3N_4$. A barrier metal layer 37 made of, e.g., Cr, Cu, Ti or TiW, is formed on the surface of the bonding pads 33. A photoresist layer 47, preferably having a thickness of 30–60 μm, and made of, e.g., photosensitive polyimide, is formed on the insulating layer 35. The photoresist layer 47 is patterned, e.g., by means of a conventional photolithography process, to expose the majority of the barrier metal layer 37. Bumps 39, e.g., made of Au, Cu, Au/Cu, or a solder such as Pb/Sn, Pb/Sn/Ag are formed on the exposed portions of the barrier metal layer 37. In accordance with the present invention, the photoresist layer 47 also serves as a protective layer, thereby enabling the package to be made thinner than prior art packages. The bumps 39 are bonded with only an inner lead portion 41 of the leads 45 being attached to polyimide tape or substrate 43. The photoresist layer 47 formed between the bumps 39 and the edge of the chip is pressed down a predetermined depth by compressive force when the inner lead portions 41 are bonded to the polyimide tape 43.

Figure 3A:
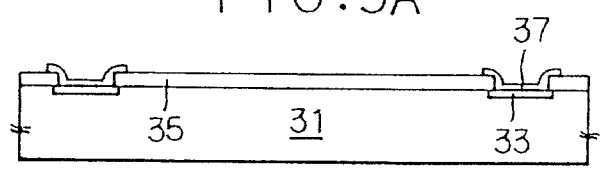
Figure 3B:
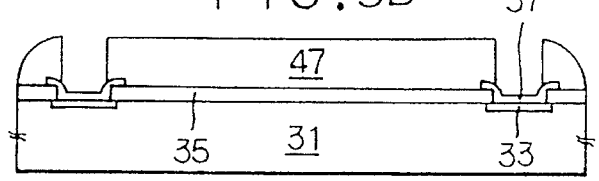
Figure 3C:
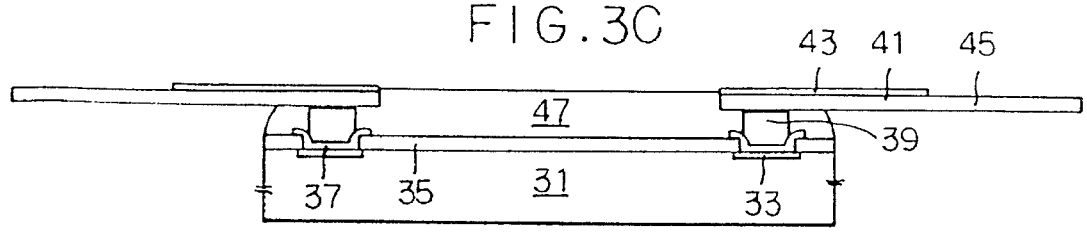

FIGS. 3A–3C depict successive steps of a process for fabricating the semiconductor package shown in FIG. 2. More particularly, with reference now to FIG. 3A, bonding pads 33 are formed on predetermined portions of a semiconductor substrate 31. Then, an insulating layer 35 is formed on the remaining portions of the semiconductor substrate 31. Next, contact holes are formed in the insulating layer 35, to thereby expose the bonding pads 33. Then, a barrier metal layer 37, made of, e.g., Cr, Cu, Ti, or TiW, is formed on the entire surface of the resultant structure. Next, all portions of the barrier metal layer 37 are removed except for those portions thereof in contact with and closely adjacent to the bonding pads 33.

Referring to FIG. 3B, a photoresist layer 47 made of, e.g., photosensitive polyimide, is deposited to a thickness of, e.g., 30–60 μm, over the entire surface of the resultant structure. Then, contact holes are formed in the photoresist layer 47, to thereby expose the barrier metal layer 37.

Referring to FIG. 3C, bumps 39 are formed on the exposed barrier metal layer 37 by electroplating Au, Au/Cu, Cu, Pb/Sn, Pb/Sn/Ag, or the like. The surfaces of the bumps 39 are formed to be substantially co-planar with the upper surface of the photoresist layer 47. Next, inner lead portions 41 of a tape 43 are bonded with the bumps 39 by a thermal compressing or reflowing method. During this step, the inner lead portions 41 compress the photoresist layer 47 between the bumps 39 and the edge of the chip by a predetermined depth. Thus, the adhesive bond between the bumps 39 and the inner lead portions 41 is strengthened relative to prior art packages. Further, the size of the bumps 39 can be controlled by the photoresist layer 47, thereby preventing neighboring bonding pads 33 from being bridged together, as well as the shorting between the inner lead portions 41 and the edges of the chip.

Based on the above and foregoing, it can now be appreciated that a package constructed in accordance with the present invention can be made thinner than prior art packages, since an additional protective layer is not required after bonding. The package of the present invention also has improved reliability, e.g., by preventing the prior art problems of shorting between the inner leads and the edge of the chip and bridging between neighboring bonding pads and improved adhesion between the inner leads and the bumps.

Although the present invention has been described only with respect to a TAB package, it is also applicable to flip-chip packages which are bonded by bumps.

What is claimed is:

1. A method for making a semiconductor package, comprising the steps of:

forming a plurality of bonding pads on portions of a semiconductor substrate;

forming an insulating layer on said substrate;

forming contact holes in said insulating layer to expose said bonding pads;

forming a barrier metal layer on said bonding pads;

forming a photoresist layer on said insulating layer, said photoresist layer having a lower surface in contact with said insulating layer, and an upper surface;

forming contact holes in said photoresist layer to thereby expose said barrier metal layer;

forming bumps on said barrier metal layer;

providing a tape substrate having lower and upper surfaces, and a plurality of leads having end portions with an upper surface attached to said lower surface of said tape substrate and a lower surface;

bonding said lower surface of said end portions of said leads to said bumps, without removing said photoresist layer;

wherein said photoresist layer is not removed, and thereby serves as both a mask for facilitating deposition of said bumps on said barrier metal layer, and as a permanent protective layer; and wherein said upper surface of said photoresist layer lies in a plane disposed below a first plane defined by said upper surface of said tape substrate, but above a second plane defined by said lower surface of said tape substrate.

2. The method as set forth in claim 1, wherein said bonding step is carried out by means of a thermocompression process.

3. The method as set forth in claim 1, wherein said bonding step is carried out by means of a reflow process.

4. The method as set forth in claim 1, wherein said forming bumps step is carried out by forming said bumps to be substantially coplanar with said upper surface of said photoresist layer.

5. The method as set forth in claim 1, wherein said forming bumps step is carried out by means of an electroplating method.

6. The method as set forth in claim 1, wherein said photoresist layer is made of photosensitive polyimide.

7. The method as set forth in claim 1, wherein said bumps are made of a material selected from a group consisting of Au, Cu, Au/Cu, Pb/Sn, and Pb/Sn/Ag.

8. The method as set forth in claim 1, wherein said barrier metal layer is made of a material selected from a group consisting of Cr, Cu, Ti, and TiW.

9. The method as set forth in claim 1, wherein said bonding pads are made of aluminum.

10. The method as set forth in claim 1, wherein said tape substrate comprises TAB tape.

11. The method as set forth in claim 2, wherein said tape substrate comprises polyimide tape.

12. The package as set forth in claim 1, wherein said photoresist layer does not contact said upper surface of said tape substrate.

13. The method as set forth in claim 1, wherein said photoresist layer does not project beyond said upper surface of said tape substrate.

14. A method for making a semiconductor package, comprising the steps of:

forming a plurality of bonding pads on portions of a semiconductor substrate;

forming an insulating layer on said substrate;

forming contact holes in said insulating layer to expose said bonding pads;

forming a barrier metal layer on said bonding pads;

forming a photoresist layer on said insulating layer, said photoresist layer having a lower surface in contact with said insulating layer, and an upper surface;

forming contact holes in said photoresist layer to thereby expose said barrier metal layer;

forming bumps on said barrier metal layer;

providing a tape substrate having lower and upper surfaces, and a plurality of leads having end portions with an upper surface attached to said lower surface of said tape substrate and a lower surface;

bonding said lower surface of said end portions of said leads to said bumps;

wherein said photoresist layer serves as both a mask for facilitating deposition of said bumps on said barrier metal layer, and as a protective layer; and, wherein said upper surface of said photoresist layer lies in a plane disposed below a first plane defined by said upper surface of said tape substrate, but above a second plane defined by said lower surface of said tape substrate.

* * * * *